US006734728B1

United States Patent
Leighton et al.

(10) Patent No.: US 6,734,728 B1
(45) Date of Patent: May 11, 2004

(54) RF POWER TRANSISTOR WITH INTERNAL BIAS FEED

(75) Inventors: Larry Leighton, Scottsdale, AZ (US); Prasanth Perugupalli, Gilbert, AZ (US); Nagaraj V. Dixit, Gilbert, AZ (US); Gordon C. Ma, Phoenix, AZ (US)

(73) Assignee: Infineon Technologies North America Corp., Iselin, NJ (US)

( * ) Notice: Subject to any disclaimer, the term of this patent is extended or adjusted under 35 U.S.C. 154(b) by 0 days.

(21) Appl. No.: 10/324,694

(22) Filed: Dec. 19, 2002

(51) Int. Cl.⁷ ............................. H03F 3/04; H03F 3/14
(52) U.S. Cl. ..................... 330/66; 330/302; 330/307; 257/401
(58) Field of Search ..................... 330/66, 307, 302; 257/401, 300, 379

(56) References Cited

U.S. PATENT DOCUMENTS 4,037,168 A * 7/1977 Katoh et al. ................. 330/31
6,127,894 A * 10/2000 Alderton ..................... 330/286

FOREIGN PATENT DOCUMENTS

JP    353016588    * 2/1978

* cited by examiner

*Primary Examiner*—Michael B. Shingleton
(74) *Attorney, Agent, or Firm*—Baker Botts L.L.P.

(57) ABSTRACT

Conventional broadband RF power amplifiers use a ¼ wavelength transmission line to decouple the gate bias DC source from the gate circuitry and a second ¼ wavelength transmission line to decouple the drain bias DC source from the drain circuitry, taking up considerable printed circuit board space. A novel broadband RF power amplifier uses a transistor with separate terminals for injection of gate bias and drain bias DC sources, eliminating the need for ¼ wavelength transmission lines, thereby freeing up space and allowing higher density packaging. The power amplifier transistor can be implemented with a single die circuit or multiple die circuits operating in parallel.

28 Claims, 8 Drawing Sheets

RF POWER TRANSISTOR WITH INTERNAL BIAS FEED

FIELD OF THE INVENTION

The present invention pertains generally to the field of radio frequency (RF) amplifiers and more specifically to high frequency, high power transistors used in wireless communication applications.

BACKGROUND

The use of RF power amplifiers in wireless communication applications is well known. With the recent growth in the demand for wireless services, such as personal communication services, the operating frequency for wireless networks has increased dramatically and is now in excess of two gigahertz. RF power amplifier stages are commonly used in wireless communication network radio base station amplifiers. Such power amplifiers are also widely used in other RF-related applications, such as cellular telephones, paging systems, navigation systems, television, avionics, and military applications. At the, high frequencies that such circuits must operate, impedance matching and biasing of the active elements is an important factor for efficient operation of the power amplifier. The input and output circuits used to match power transistors to external devices are typically implemented with a combination of bondwire inductance, stripline or microstrip structures on a printed circuit board, and discrete capacitors.

A typical common source power amplifier stage, as illustrated in FIGS. 2 and 3, has an RF feed, a power transistor 200, and an RF output. The power transistor 200 is a three terminal device, having an input terminal 210, an output terminal 220, and a common terminal that is the flange 205 which is grounded. The power transistor 200 amplifies the low power signal coming from the RF feed, into a high power signal delivered from the RF output to a load. An input bias network provides a DC voltage, called the input bias feed, to the power transistor 200 establishing an input operating point for the transistor 200. An output bias network provides a DC voltage, called the output bias feed, to the power transistor 200 establishing an output operating point for the transistor 200.

An input impedance transformer 231 transforms the impedance of the RF feed (typically 50 ohms) into the impedance at input terminal 210 (typically 8–10 ohms) at the frequency and power level of operation. The input impedance transformer 231 is typically a microstrip transmission line of ¼ wavelength (lambda) at the operating frequency.

Similarly, an output impedance transformer 241 transforms the load impedance at the output terminal 220 (typically 1 to 10 ohms) into the impedance at the RF output (typically 50 ohms) at the frequency and power level of operation. The output impedance transformer 241 is also preferably a microstrip transmission line of ¼ lambda at the operating frequency.

Input blocking capacitor 232 prevents DC voltages from entering the wrong amplifier stage. Output blocking capacitor 242 prevents loading by the RF output circuits by blocking DC voltages from the RF output.

In addition, it is important to prevent high frequency signals generated inside the power amplifier stage from escaping along unwanted transmission paths. In order to prevent the high frequency signals in the power amplifier from contaminating the sources of DC voltage which bias the amplifier, designers typically use a ¼ lambda transmission line, implemented with a microstrip structure. Transmission line theory predicts that a ¼ lambda transmission line terminated at its distal end with a short circuit has an input impedance, at the proximal end, that is equal to an open circuit. As a practical matter, a one-quarter wavelength transmission line terminated with a relatively low impedance presents a high impedance to the driving source. This approach prevents RF power directed toward the input terminal 210 from leaking into the input bias network, and provides a method of coupling a DC voltage into the power transistor 200, without disturbing the impedance matching structures.

For instance, on the input bias circuit illustrated in FIGS. 2 and 3, an input bias transmission line 233 is a ¼ lambda transmission line which has its distal end coupled to the DC voltage source of input bias feed. The proximal end is coupled to the power transistor input terminal 210. The combination of the DC voltage source of input bias feed, and decoupling capacitors 234 and 235 approaches a short circuit over a broad range of frequencies at the distal end of line 233.

Capacitor 234 has a small capacitance value and is selected to have series resonance at or near the operating frequency. Typical values for capacitor 234 are 5 to 50 pF with ceramic dielectric. Capacitor 235 has a large capacitance value and is selected to have high capacitive reactance and moderate inductance for lower intermediate frequencies. Typical values for capacitor 235 are 0.05 to 0.5 uF with tantalum dielectric. Should the amplifier be operated as a Continuous Wave (CW) amplifier, capacitor 235 is not required for adequate decoupling.

The DC voltage source of input bias feed voltage forms a short circuit for low frequency AC signals and DC. Since the distal end of the line 233 is terminated with a short circuit, the input impedance of the line 233 at the proximal end appears to be an open circuit to the high frequency signals near the input terminal 210. This open circuit blocks RF signals from escaping along unwanted paths, and in particular from contaminating the DC voltage source of input bias feed.

Similarly, a ¼ lambda transmission line is used to prevent RF signals from the output terminal 220 from flowing back into the DC voltage source of the output bias feed. An output bias transmission line 243 is a ¼ lambda transmission line which has its distal end coupled to the DC voltage source of output bias feed. The proximal end is coupled to the power transistor output terminal 220. The combination of the DC voltage source of output bias feed, and decoupling capacitors 244 and 245 form s a short circuit over a broad range of frequencies at the distal end of line 243. Capacitor 244 has a small capacitance value and is selected to have series resonance at or near the operating frequency. Typical values for capacitor 244 are 5–50 pF with ceramic dielectric. Typical values for capacitor 245 are 0.05 to 0.5 uF with tantalum dielectric. Since the distal end of the line 243 is terminated with a short circuit, the input impedance of the line 243 at the proximal end appears to be an open circuit to the signals near the output terminal 220 which blocks RF signals from contaminating the DC voltage source of output bias feed.

Although using a ¼ lambda transmission line for providing input and output bias to transistor 200 has been found to be a practical biasing solution, there are several factors that make its use less than optimal. Considerable area on the printed circuit board is required for its implementation, reducing the packaging density for the amplifier. In addition, the ¼ lambda transmission tends to radiate RF energy, reducing the overall amplifier efficiency. Further, coupling the ¼ lambda transmission line to the power transistor input is difficult to model due to unequal distributed element effects that complicate the design process.

The physical configuration of a typical power transistor 200 is illustrated, in more detail, in FIG. 1A, and an equivalent circuit for transistor 200 appears in FIG. 3. The power transistor 200 has a transistor die 219, a gate tuning network, and a drain tuning network. The transistor die 219 is preferably a field effect transistor die and particularly a lateral diffused metal-oxide-silicon device (LDMOS) with a gate and drain region formed on the upper surface. A high conductivity sinker region is formed to provide a low resistance conduction path between a source region and the lower surface of the die 219. The die 219 is bonded to the flange 205, thereby thermally and mechanically coupling the die to the flange and electrically coupling the source to the flange. In the figures and text that follow, the transistor die is illustrated to be an LDMOS device, a skilled practitioner will appreciate that there are numerous other die type choices which will produce an acceptable amplifier.

Bond wires are used to electrically couple the gate of a die 219 to the input terminal 210 and the drain of the die 219 to the output terminal 220. Bond wires are also used to interconnect other components. These bond wires have self-inductance that cannot be neglected at typical frequencies of operation. The gate tuning network is required to effectively couple RF power coming from the RF feed to the gate of the die 219. Similarly, the drain tuning network is also required to effectively couple RF power coming from the drain of the die 219 to the RF output and load.

The gate matching network provides compensation for the bond wire inductors, as well as the input capacitance associated with the gate of the die 219. The gate tuning network includes a "T-network," and a "shunt network." The T-network includes a first bond wire inductance 211 coupled to the input terminal 210, a second bond wire inductance 212 coupled to the gate of the die 219, and a first input capacitor 216 coupled to ground on the flange 205, each coupled to a central node. The shunt network includes a third bond wire inductance 213 coupled to a second input capacitance 217 of relatively high capacitance. Second input capacitance 217 is a blocking capacitor, which prevents the inductance 213 from shorting the DC bias at the gate of the die 219 to ground. The third input bond wire inductance 213 is coupled to the gate of die 219, and the second input capacitor 217 is coupled to ground on the flange 205.

The T-network transforms the impedance "looking" into the transistor input terminal 210 at the fundamental frequency to match the output impedance of line 231. The shunt network provides resonance at the fundamental signal frequency, while negating gate reactance.

The drain matching network provides compensation for the bond wire inductors, as well as the capacitance associated with the drain of die 219. The drain tuning network includes a shunt network and a series inductance. The series inductance is the result of a fifth bond wire 215 connecting the drain of the die 219 to the output terminal 220. The shunt network includes a fourth bond wire inductance 214 coupled to an first output capacitor 218. The fourth bond wire inductance 214 is coupled to the drain of the die 219, and the first output capacitor 218 is coupled to ground on the flange 205. These components provide broadband matching at a predetermined load impedance, to provide a desired power level for efficient amplifier operation.

FIG. 1B illustrates the physical configuration of an alternate form of a power transistor. 100 with two circuits similar to those of transistor 200 coupled and operating in parallel. Like transistor 200, transistor 100 has three terminals: an input terminal 110, an output terminal 120, and a flange 105. A first die circuit has a die, a gate tuning network, and a drain tuning network. A second die circuit has a die, a gate tuning network, and a drain tuning network. Within economical and practical manufacturing tolerances, the two die circuits are matched so that the load is shared by each die circuit approximately equally. Each circuit functions as described above with transistor 200. The skilled practitioner will also appreciate that three or more die circuits can be coupled in parallel to provide additional power handling capability.

The input bias transmission line 233 and output bias transmission line 243 take up considerable and valuable space on the printed circuit board that contains them. Three terminal RF power transistor packages have limited the choices that designers have available to them for providing input bias voltage and output bias voltage. The need for increasingly high density packaging in RF amplifiers suggests that reducing the board space consumed by an amplifier stage is desirable and lowers cost. Thus there is a need for an input biasing circuit and output biasing circuit which makes more efficient use of printed circuit board space, without substantial performance loss.

SUMMARY OF INVENTIONS

In accordance with a general aspect, inventions disclosed and described herein are directed to high frequency, high power, broadband RF amplifiers designed and constructed to overcome the above-described problems, and allow for easier large-scale manufacturing.

In one embodiment, the broadband RP amplifier includes a power transistor package with 5 terminals. As illustrated in FIG. 4A, power transistor 300 has an input terminal 310, an output terminal 320, a flange 305, an input bias terminal 350, and an output bias terminal 360. The addition of the input bias terminal 350 when used in cooperation with a novel biasing circuit, eliminates the need for a ¼ lambda input bias transmission line, thereby reducing the total area occupied by the amplifier stage. The output bias terminal 360 is treated in a similar way, eliminating the need for a ¼ lambda output bias transmission line.

In another embodiment, the broadband RF amplifier includes a power transistor package with 7 terminals. As illustrated in FIG. 4B, power transistor 500 has an input terminal 510, an output terminal 520, a flange 505, a first input bias terminal 550, a second input bias terminal 551, a first output bias terminal 560, and a second output bias terminal 561. The addition of the first and second input bias terminals, 550 and 551 respectively, when used in cooperation with a novel biasing circuit, eliminates the need for a first and second ¼ lambda input bias transmission line, thereby reducing the total area occupied by the amplifier stage. Similar for the first and second output bias terminals.

Other aspects and features of the inventions disclosed herein will become apparent hereinafter.

BRIEF DESCRIPTION OF THE DRAWINGS

The drawings illustrate both the design and utility of preferred embodiments of the disclosed inventions, in which similar elements in different embodiments are referred to by the same reference numbers for ease in illustration, and wherein.

DETAILED DESCRIPTION OF PREFERRED EMBODIMENTS

Figure 1B:
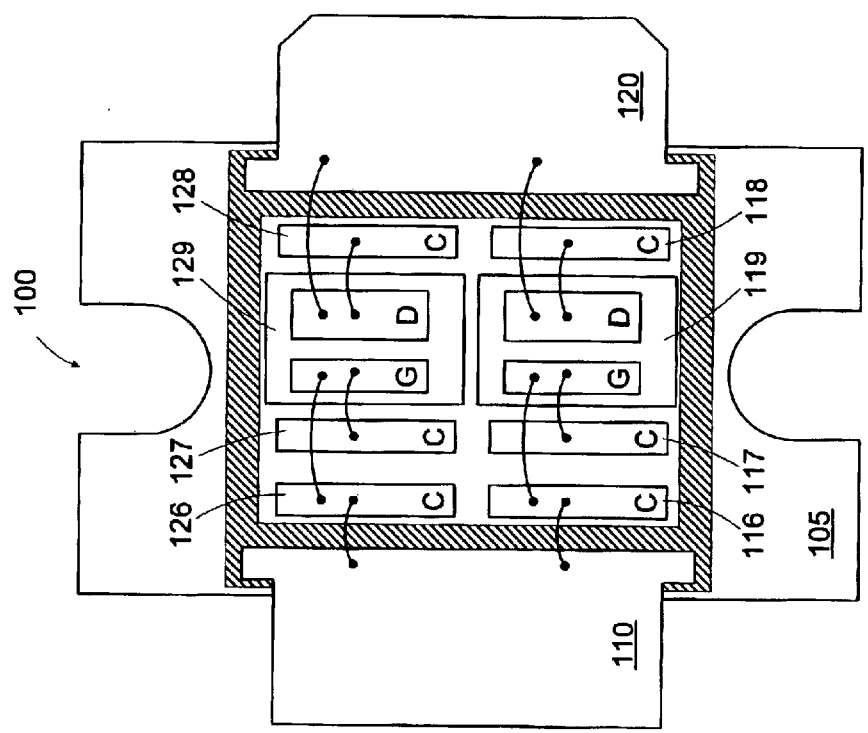
FIG. 1B illustrates the physical configuration of an alternate prior-art RF power transistor, with two die circuits coupled and operating in parallel.
Figure 1A:
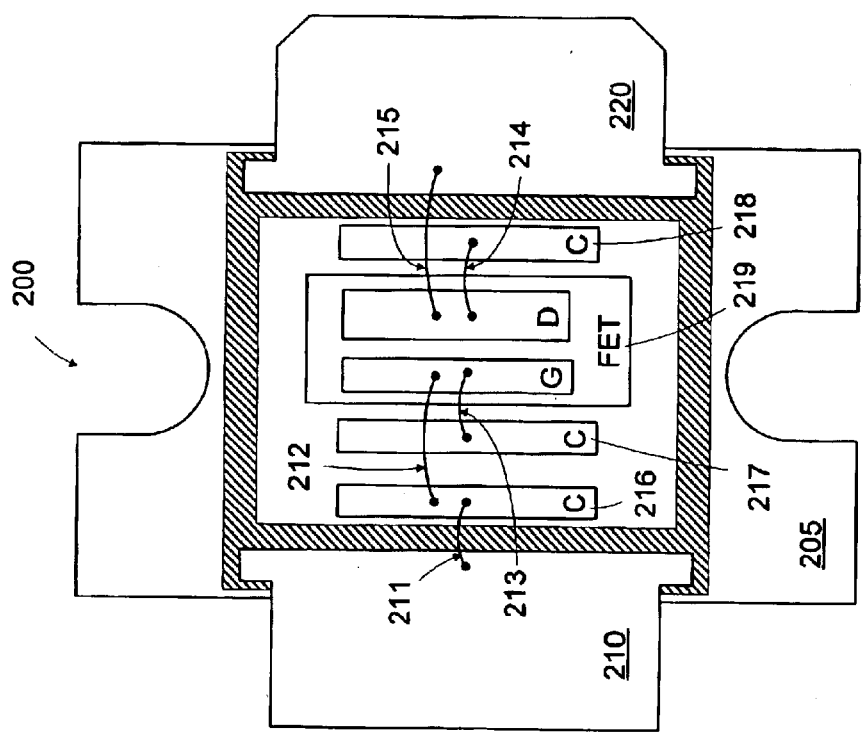
FIG. 1A illustrates the physical configuration of a typical prior-art RF power transistor with one die circuit.
Figure 4B:
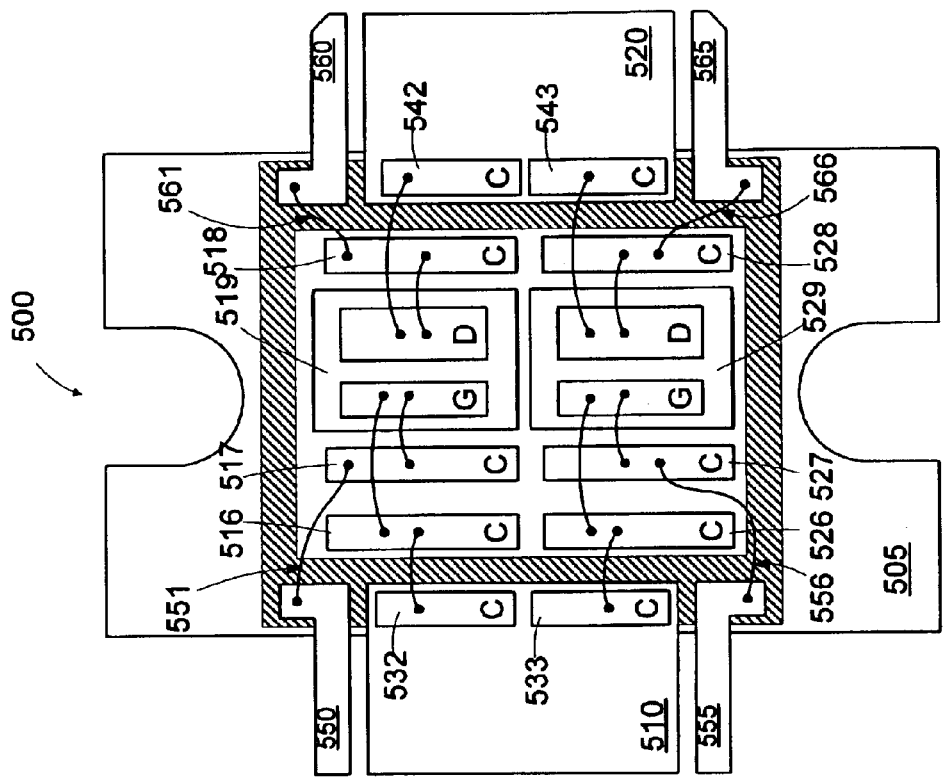
FIG. 4B illustrates the physical configuration of a novel RF power transistor with two die circuits coupled and operating in parallel. The power transistor has DC blocking at the input and output terminals and a separate input bias terminal and output bias terminal for each die.
Figure 4A:
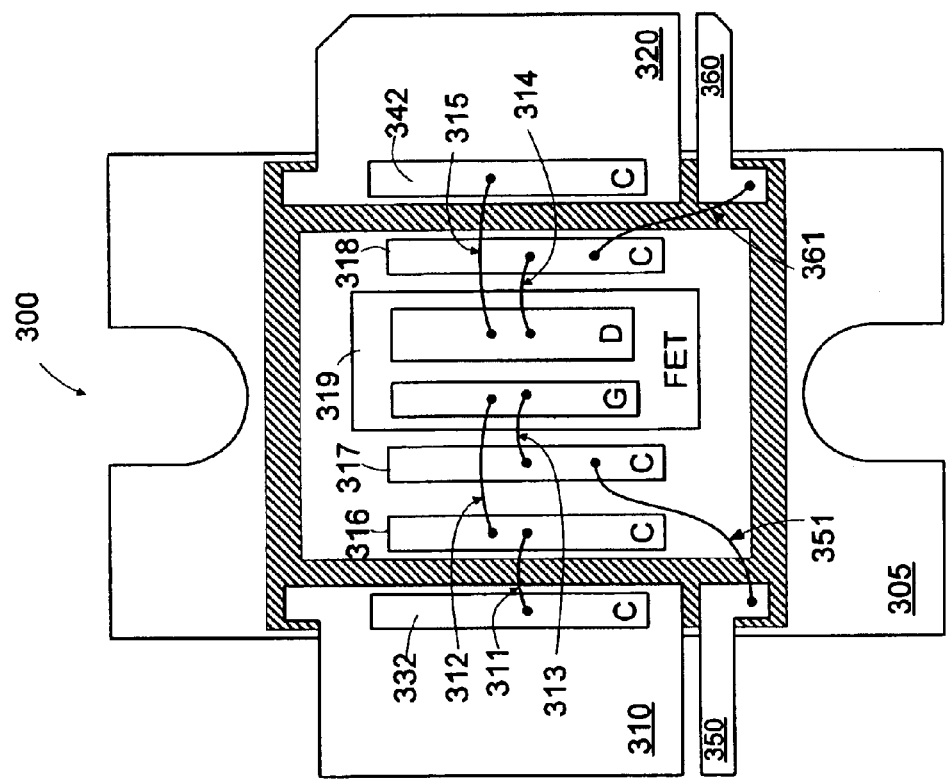
FIG. 4A illustrates the physical configuration of a novel RF power transistor with one die circuit. The power transistor has DC blocking at the input and output terminals and a separate input bias terminal and output bias terminal.
Figure 6:
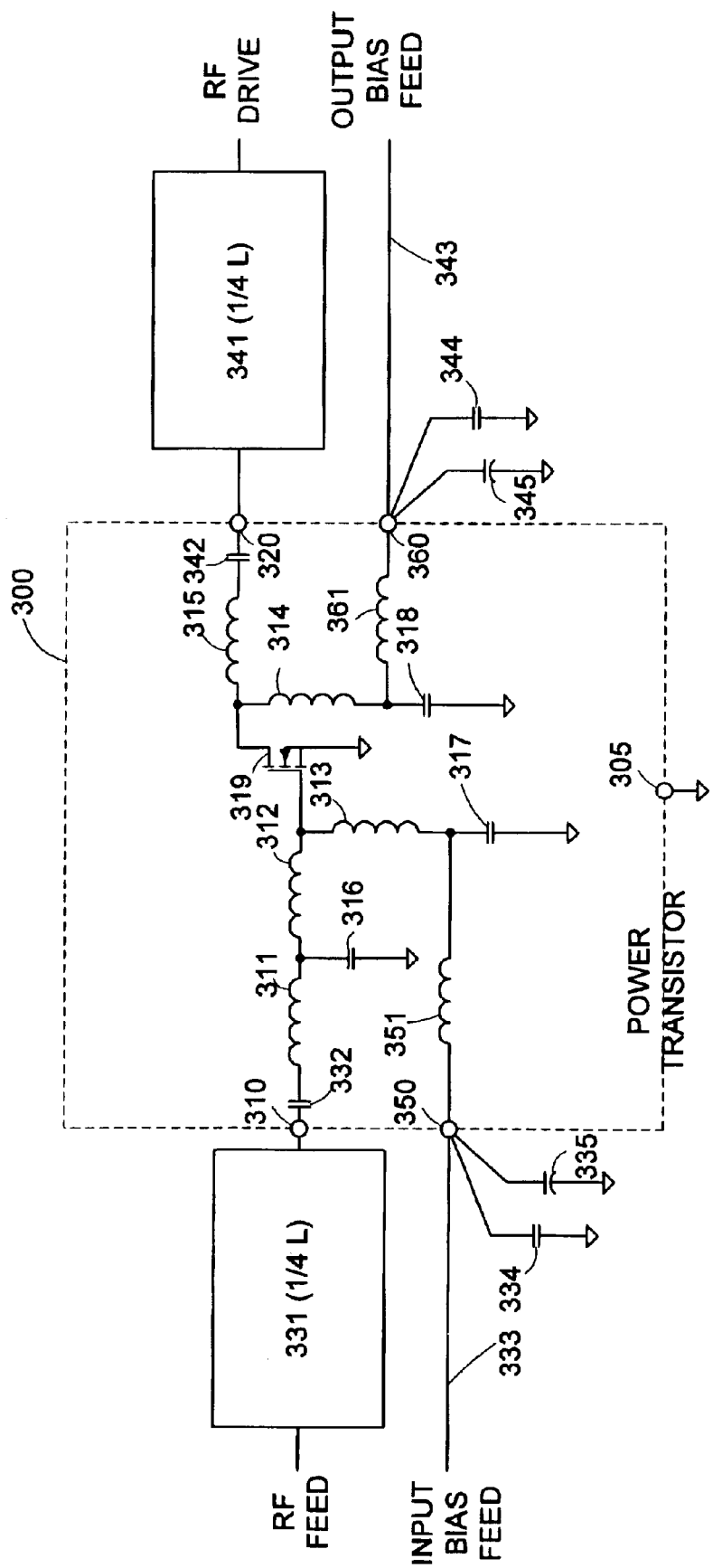
FIG. 6 is an equivalent circuit schematic for the novel broadband RF power amplifier section illustrated in FIG. 5.

FIG. 4A illustrates the physical configuration of a novel power transistor 300 and an equivalent circuit for transistor 300, which appears in FIG. 6. Similar to the prior art transistor of FIG. 1A, this power transistor 300 has an input terminal 310, an output terminal 320, a field effect transistor die 319, a gate matching network, and a drain matching network.

The field effect transistor die 319 is preferably an LDMOS device. The die 319 is bonded to the flange 305, thereby thermally and mechanically coupling the die 319 to the flange and electrically coupling the source to the flange 305. Unlike the prior art transistor of FIG. 1A, this transistor 300 has an input bias terminal 350 and an output bias terminal 360, making transistor 300 a five terminal device. In the figures and text that follow, the transistor die is illustrated to be an LDMOS device, a skilled practitioner will appreciate that there are numerous other die type choices which will produce an acceptable amplifier.

Figure 2:
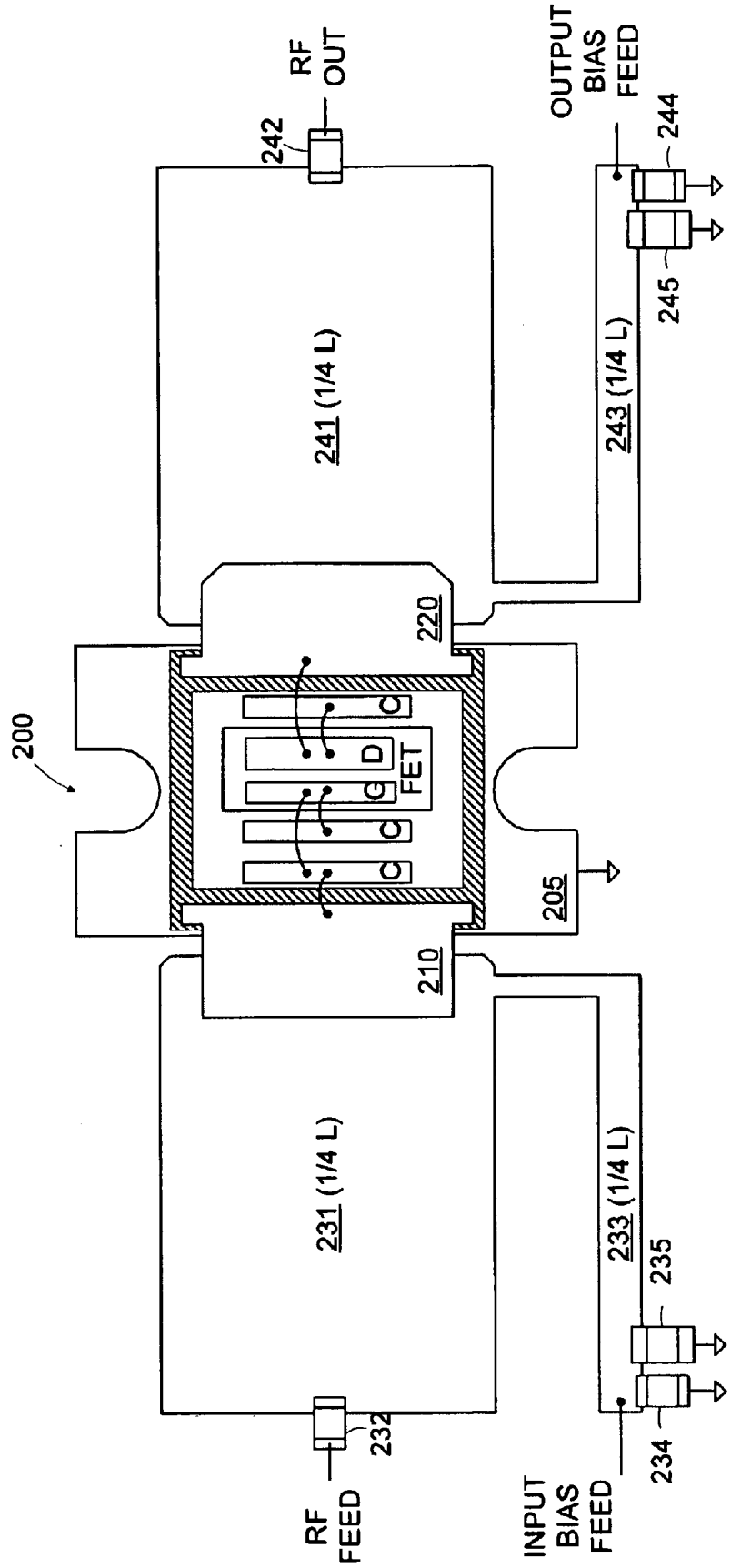
FIG. 2 illustrates the physical configuration of a prior-art broadband RF power amplifier section, using the power transistor of FIG 1A.
Figure 3:
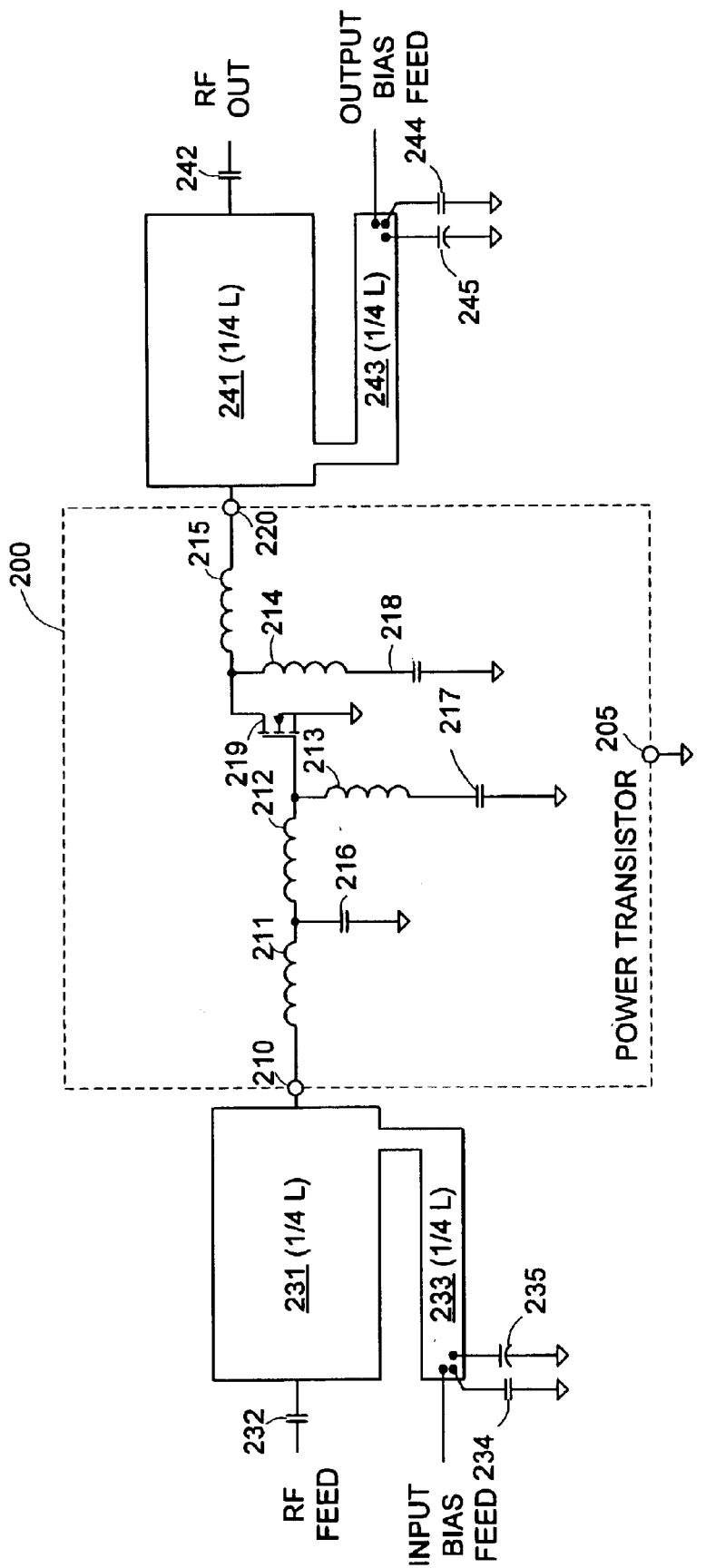
FIG. 3 is an equivalent circuit schematic for the prior-art broadband RF power amplifier section illustrated in FIG. 2.

In addition, also note that the transistor 300 has an input DC blocking capacitor 332 and output DC blocking capacitor 342. In the prior art amplifiers, these capacitors were external to the transistor illustrated in FIGS. 2 and 3. Input blocking capacitor 332 has its first terminal bonded to the input terminal 310 at a location proximal to the die 319 and its second terminal electrically coupled to the gate of the die 319. Output blocking capacitor 342 has its first terminal bonded to the output terminal 320 at a location proximal to the die 319 and its second terminal electrically coupled to the drain of the die 319.

Bond wires are used to electrically couple components of transistor 300. These bond wires have self-inductance that, in many cases, cannot be neglected at typical frequencies of operation. Bond wires are used to electrically couple the gate of the die 319 to the input terminal 310 through input blocking capacitor 332, and to electrically couple the drain of the die 319 to the output terminal 320 through output blocking capacitor 342. A gate matching network is required to effectively couple RF power coming from the RF feed to the gate of the die 319. Similarly, a drain matching network is also required to effectively couple RF power coming from the drain of the die 319 to the RF output and load.

The gate matching network provides compensation for the bond wire inductors, as well as the input capacitance associated with the gate of the die 319. Referring to FIG. 6, the gate matching network includes a "T-network," and a "shunt network." The T-network includes a first bond wire inductance 311 coupled to the input blocking capacitor 332, a second bond wire inductance 312 coupled to the gate of the die 319, and a first input capacitor 316 coupled to ground on the flange 305, each coupled to a central node. The shunt network includes a third bond wire inductance 313 coupled to a second input capacitance 317 of relatively high capacitance. Second input capacitance 317 is a blocking capacitor, which prevents the inductance 313 from shorting the DC bias at the gate of the die 319 to ground. The third bond wire inductance 313 is coupled to the gate of die 319, and the second input capacitor 317 is coupled to ground on the flange 305.

The T-network transforms the impedance "looking" into the transistor input terminal 310 at the operating frequency to match the output impedance of line 331. The shunt network provides resonance at the fundamental signal frequency, while negating gate reactance.

The drain tuning network provides compensation for the bond wire inductors, as well as the capacitance associated with the drain of die 319. The drain tuning network includes a shunt network and a series inductance. The series inductance is the result of a fifth bond wire 315 connecting the drain of die 319 to the output blocking capacitor 342. The shunt network includes a fourth bond wire inductance 314 coupled to a first output capacitor 318. The fourth bond wire inductance 314 is coupled to the drain of die 319, and the first output capacitor 318 is coupled to ground on the flange 305. These components provide broadband matching at a predetermined load impedance, to provide a desired power level for efficient amplifier operation.

An input bias bondwire 351 is used to electrically couple the input bias terminal 350 to the gate of the die 319 via the second input capacitor 317. An output bias bondwire 361 is used to electrically couple the output bias terminal 360 to the drain of the die 319 via the first output capacitor 318.

Figure 5:
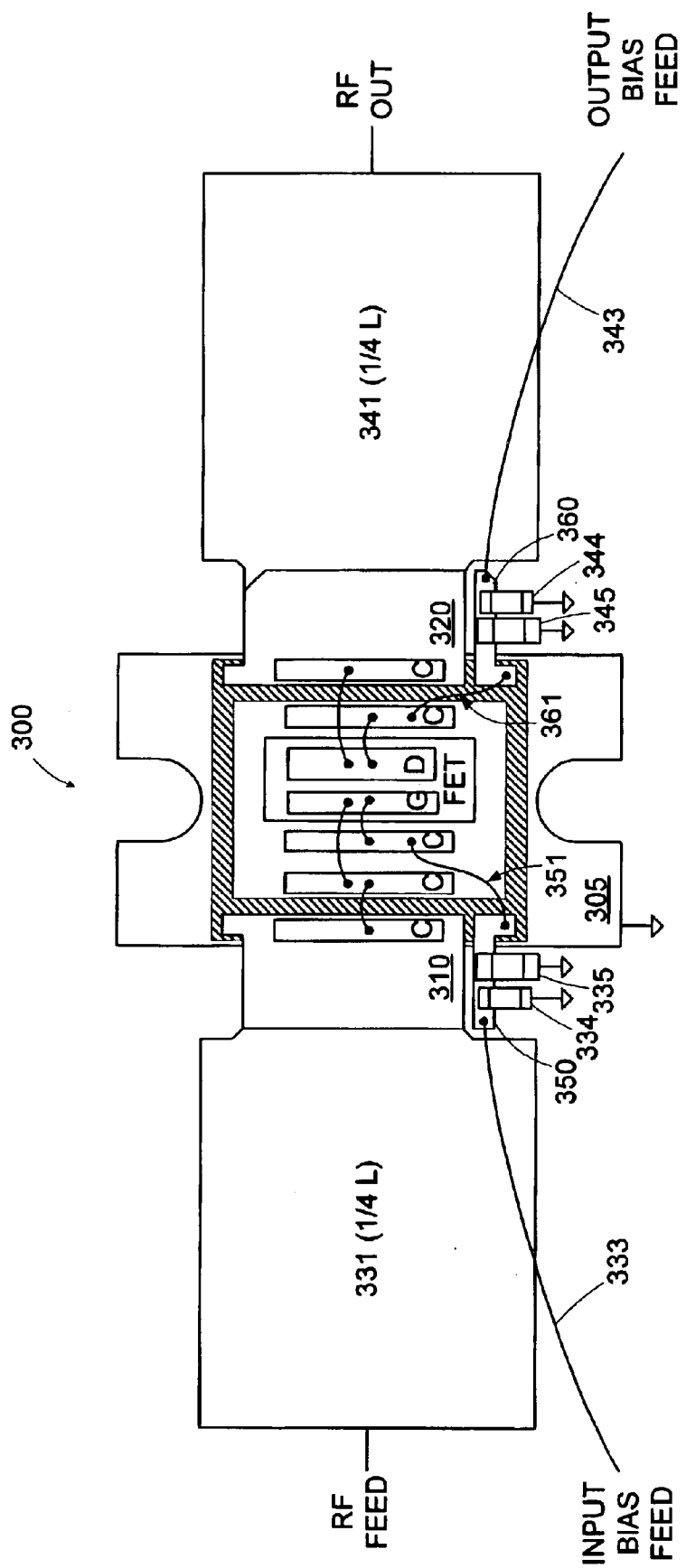
FIG. 5 illustrates the physical configuration of a novel broadband RF power amplifier section, using the power transistor of FIG. 4A.

FIGS. 5 and 6 illustrate the use of transistor 300 in a novel common source power amplifier stage. Similar to the prior art power amplifier of FIGS. 2 and 3, this power amplifier has an RF feed, a power transistor 300, and an RF output It is important to note, however, that the input bias feed is not electrically coupled to the gate with a ¼ lambda transmission line. Rather, the input bias feed is electrically coupled directly to the input bias feed terminal 350. Similarly, the output bias feed is electrically coupled directly to the output bias feed terminal 360.

Recall from FIG. 4A that the power transistor 300 is a five terminal device, having an input terminal 310, an output terminal 320, a flange 305 which is grounded, an input bias terminal 350 and an output bias terminal 360. Similar to the prior art amplifier illustrated in FIGS. 2 and 3, the power transistor 300 in FIGS. 5 and 6, amplifies the low power, signal coming from the RF feed, into a high power signal delivered from the RF output to a load. An input impedance transformer 331 transforms the impedance of the RF feed into the impedance at the input terminal 310. The input impedance transformer 331 is preferably a microstrip transmissions line of ¼ lambda at the operating frequency. An output impedance transformer 341 transforms the impedance at the output terminal 320 into the impedance at the RF output. The output impedance transformer 341 is also preferably a microstrip transmission line of ¼ lambda at the operating frequency.

Input blocking capacitor 332 (FIG. 6) blocks internal and external DC voltages from entering or leaving the power transistor 300 via the input terminal 310. Output blocking capacitor 342 blocks internal and external DC voltages from entering or leaving the power transistor 300 via output terminal output terminal 320.

The input bias feed provides a DC voltage to the power transistor 300 establishing an input operating point for the transistor 300. It is important to prevent high frequency signals inside the power amplifier stage from escaping along unwanted transmission paths. Of particular importance is preventing the high frequency signals in the power amplifier from contaminating the sources of DC voltage which bias the amplifier. The novel input bias feed and output bias feed circuits illustrated in FIG. 6 effectively isolate the DC voltage bias sources from high frequencies signals inside the amplifier stage and without using the prior art ¼ lambda transmission line. Rather, the DC voltage bias sources are injected into the shunt networks coupled to the transistor input and output.

The input bias feed circuit has an input bias feed conductor 333, input decoupling capacitors 334 and 335, and an input bias bondwire 351. The input bias bondwire 351 is electrically coupled to the input bias terminal 350 and in combination with the input bias feed conductor 333 provides a DC path to the gate of the die 319 through the input shunt network inductance 313. Input decoupling capacitors 334 and 335 provide a low impedance AC shunt path from the input bias feed terminal 350 to ground. The input bias bondwire inductance 351 is kept as low in value as practical.

The Input bias feed conductor 333 electrically couples the DC source of input bias feed to input bias feed terminal 350. It can be any low inductance conductor selected for this purpose, provided that it has sufficiently low inductance. A power plane, multiple fine gage bondwires, or larger gage braided, stranded or solid conductors can all be used advantageously, alone or in combination.

The first input decoupling capacitor 334 has a small capacitance value and is selected to have series resonance at or near the operating frequency. Typical values for capacitor 334 are 5 to 50 pF with ceramic dielectric. Capacitor 335 has a large capacitance value and is selected to have high capacitive value and low inductance for lower intermediate RF frequencies. Typical values for capacitor 335 are 0.05 to 0.5 uF with tantalum dielectric.

The output bias circuit operates in a similar way to the input bias circuit. It effectively isolates the DC voltage from the output bias source from high frequency signals inside the amplifier stage and without using the prior art ¼ lambda transmission line. The DC voltage from the output bias source is injected into the output shunt network coupled to the transistor output.

The output bias feed provides a DC voltage to the power transistor 300 establishing an output operating point for the transistor 300. The output bias feed circuit has an output bias feed conductor 343, output decoupling capacitors 344 and 345, and an output bias bondwire 361. The output bias bondwire 361 is electrically coupled to the output bias terminal 360 and in combination with the output bias feed conductor 343 provides a DC path to the drain of the die 319 through the output shunt network inductance 314. Output decoupling capacitors 344 and 345 provide a low impedance AC shunt path from the output bias feed terminal 360 to ground. The output bias bondwire inductance 361 is kept as low as practical.

The first output decoupling capacitor 344 has a small capacitance value and is selected to have series resonance at or near the operating frequency. Typical values for capacitor 344 are 5 to 50 pF with ceramic dielectric. Capacitor 345 has a large capacitance value and is selected to have high capacitive value and low inductance for lower intermediate RF frequencies. Typical values for capacitor 345 are 0.05 to 0.5 uF with tantalum dielectric.

FIG. 4B illustrates the physical configuration of an alternate form of a novel power transistor 500 with two die circuits, similar to those of transistor 300, coupled and operating in parallel. An equivalent circuit for this transistor 500 appears in FIG. 8. Transistor 500 has seven terminals: an input terminal 510, an output terminal 520, and a flange 505, a first input bias terminal 550, a second input bias terminal 555, a first output bias terminal 560, and a second output bias terminal 565.

A first die circuit has a die 519, a first gate tuning network, and a first drain tuning network. A second die circuit has a die 529, a second gate tuning network, and a second drain tuning network. Each die circuit functions individually as described above with transistor 300 in with FIG. 4A. Within economical and practical manufacturing tolerances, the two die circuits are matched so that each die circuit shares the load approximately equally. The skilled practitioner will also appreciate that three or more die circuits can be coupled in parallel to provide additional power handling capability.

Figure 7:
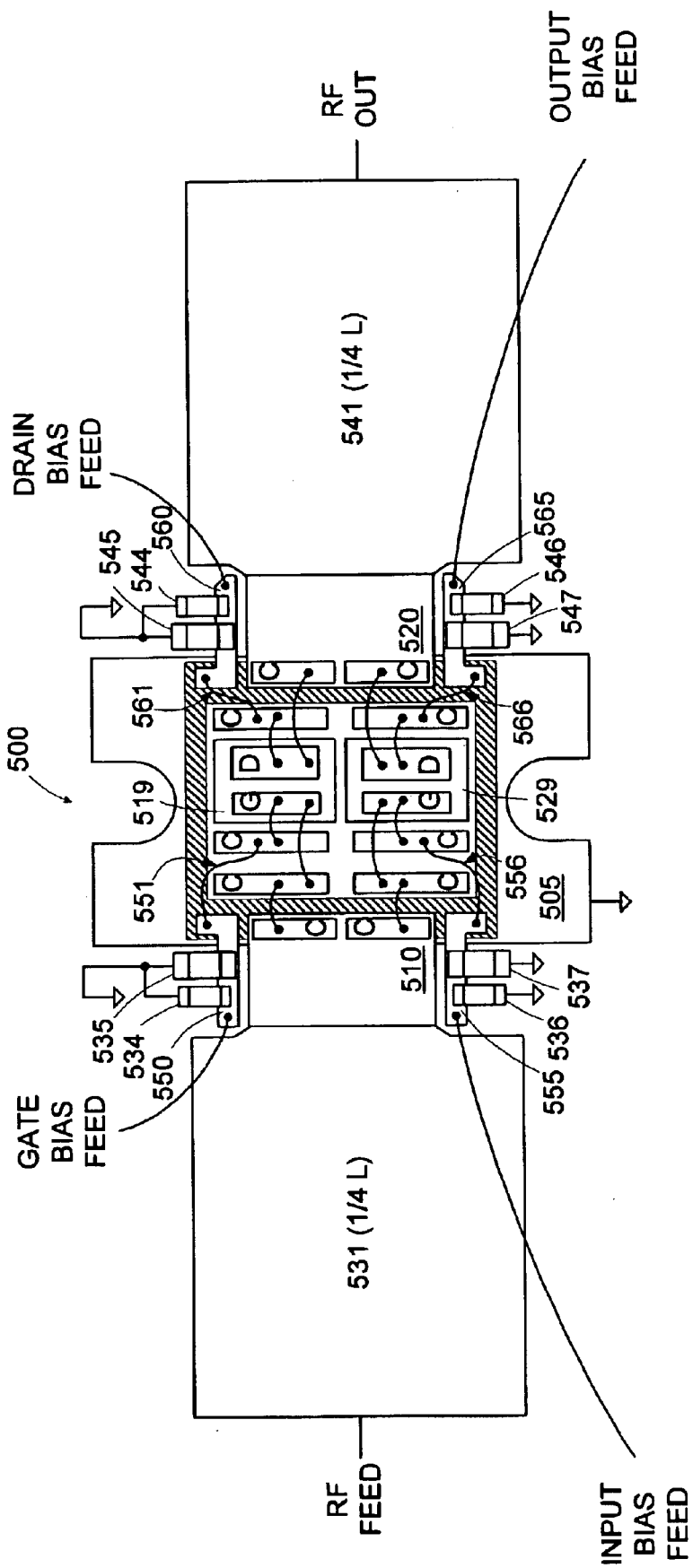
FIG. 7 illustrates the physical configuration of a novel broadband RF power amplifier section, using the power transistor of FIG. 4B.
Figure 8:
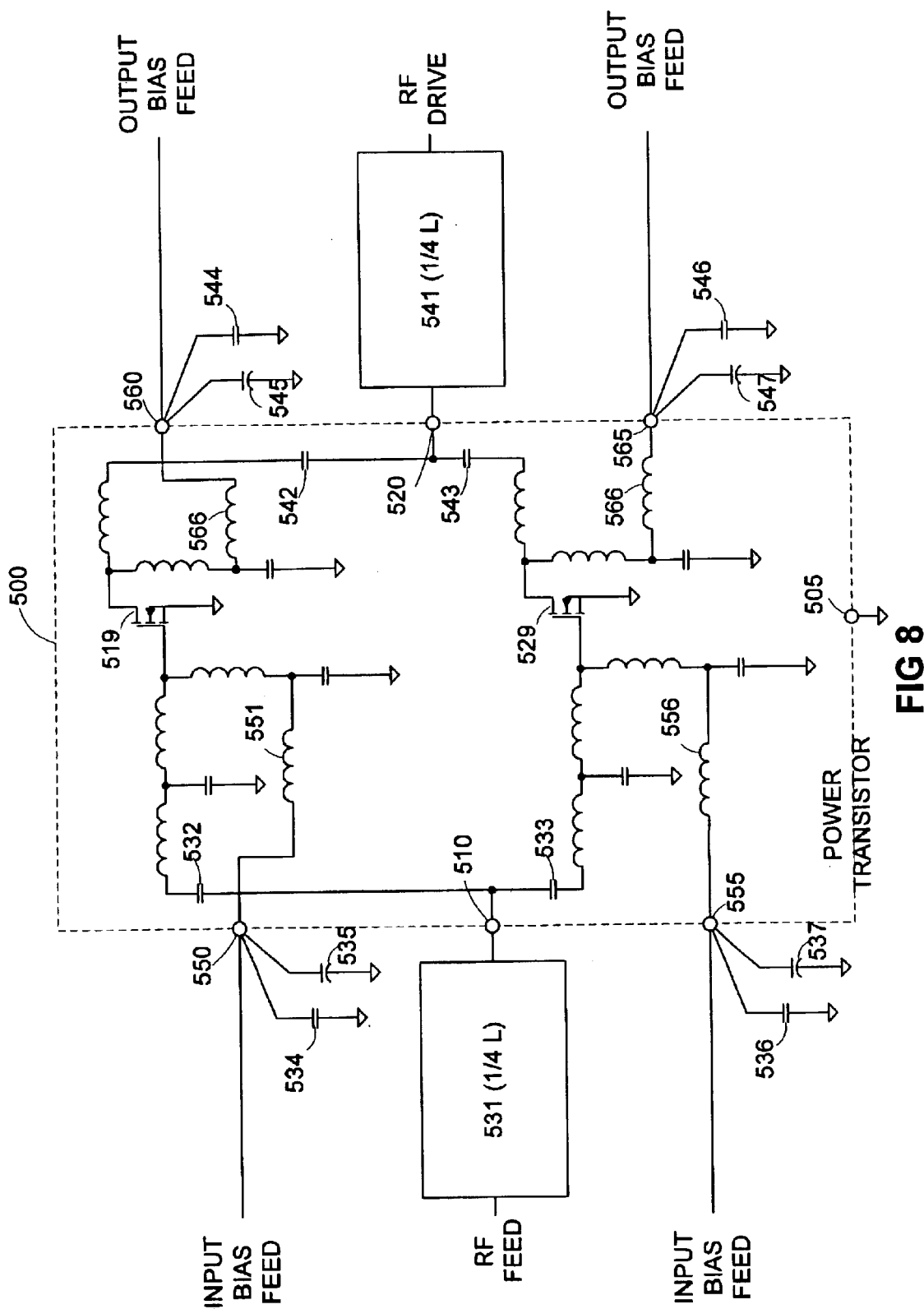
FIG. 8 is an equivalent circuit schematic for the novel broadband RF power 5 amplifier section illustrated in FIG. 7.

FIGS. 7 and 8 illustrate the use of transistor 500 in a novel common source power amplifier stage. Similar to the power amplifier of FIGS. 5 and 6, this power amplifier has an RF feed, a power transistor 500 and an RF output. This power amplifier can have a single input bias terminal and a single output bias terminal, or in contrast, it can have a separate input bias terminal and output bias terminal for each die circuit as illustrated in FIGS. 7 and 8.

Recall from FIG. 4B that the power transistor 500 is a seven terminal device, having an input terminal 510, an output terminal 520, a flange 505 which is grounded, an first input bias terminal 550, a first output bias terminal 560, a second input bias terminal 555, and a second output bias terminal 565. Similar to the prior art amplifier illustrated in FIGS. 2 and 3, the power transistor 500 amplifies the low power signal coming from the RF feed, into a high power signal delivered from the RF output to a load. An input impedance transformer 531 transforms the impedance of the RF feed into the impedance at the input terminal 510. The input impedance transformer 531 is preferably a microstrip transmission line of ¼ lambda at the operating frequency. An output impedance transformer 541 transforms the impedance at the output terminal 520 into the impedance at the RF output. The output impedance transformer 541 is also preferably a microstrip transmission line of ¼ lambda at the operating frequency.

Input blocking capacitor 532 and 533 block internal and external DC voltages from entering or leaving the power transistor 500 via the input terminal 510. Furthermore, this input terminal together with blocking capacitors 532 and 533 operates as a signal splitter distributing the incoming signal to both transistors 519, 529, respectively. Output blocking capacitor 542 and 543 block internal and external DC voltages from entering or leaving the power transistor 500 via output terminal output terminal 520. Similar as with the input terminal, the output terminal 520 together with blocking capacitors 542 and 543 operates as a signal combiner merging the signals from the transistors 519, 529 into a single output signal.

The first input bias feed circuit functions in the same way as that described in FIGS. 5 and 6 for providing a DC voltage to bias the input of the first die 519. Further, the first output bias feed circuit functions in the same way as the described in FIGS. 5 and 6 for providing a DC voltage to bias the output of the first die 519. Similarly, the second input bias feed circuit functions to provide a DC voltage to bias the input of the second die 529, and the second output bias feed circuit functions to provide a DC voltage to bias the output of the second die 529.

A skilled practitioner will appreciate that the input bias feed sources of DC voltage for the first and second die circuits can be separate sources or a shared source. Input bias feed sharing can be accomplished internal to the power transistor by the addition of a bondwire that electrically couples the gate of the first die 519 to the gate of the second die 529.

Alternatively, input bias feed sharing can also be accomplished by the addition of a bondwires that electrically couples the first shunt capacitor 517 to the second shunt capacitor 527 (Shown in FIG.4B) Further, such bondwires tend to increase amplifier stability in some applications. Either separate input bias feed or shared input bias feed configurations may be selected based on cost and performance requirements.

Similarly, the output bias feed sources of DC voltage for the first and second die circuits can be separate sources or a shared source. Output bias feed sharing can be accomplished internal to the power transistor by the addition of a bondwire that electrically couples the first output shunt capacitor 518 to the second output shunt capacitor. Further, such a bondwire tends to increase amplifier stability in some applications. Either separate output bias feed or shared output bias feed configurations may be selected based on cost and performance requirements.

Although particular embodiments of the invention have been shown and described, the invention is not limited to the preferred embodiments and it will be apparent to those killed in the art that various changes and modifications may be made without departing from the scope of the invention, which is defined only by the appended claims and their equivalents.

What is claimed:

1. Power transistor comprising:
   a flange;
   a die having a gate, a source, and a drain, wherein the source is electrically coupled to the flange;
   a gate matching circuit located on the flange having an input and an output, the output being coupled to the gate;
   a drain matching circuit located on the flange having an input and an output, the input being coupled with the drain;
   an input terminal being mechanically coupled to the flange and electrically coupled with the input of the gate matching circuit;
   an input bias terminal being mechanically, coupled to the flange and electrically coupled with the gate;
   an output terminal being mechanically coupled to the flange and electrically coupled with the input of the drain matching circuit;
   an output bias terminal being mechanically coupled to the flange and electrically coupled with the drain.

2. Transistor as in claim 1, wherein the die is a LDMOS transistor.

3. Transistor as in claim 1, wherein the gate matching network and the drain matching network each comprise a T network and a shunt network.

4. Transistor as in claim 3, wherein the bias input terminal and the bias output terminal each are coupled with the respective shunt network.

5. Transistor as in claim 3, wherein the T network comprises a first and second bond wire coupled in series and a capacitor coupled between the connection of the bond wires and source.

6. Transistor as in claim 1, further comprising an input blocking capacitor being electrically coupled between the input terminal and the gate.

7. Transistor as in claim 6, wherein the blocking capacitor is located on the proximal end of the input terminal.

8. Transistor as in claim 1, further comprising an output blocking capacitor being electrically coupled between the output terminal and the drain.

9. Transistor as in claim 8, wherein the blocking capacitor is located on the proximal end of the output terminal.

10. Transistor as in claim 1, wherein a plurality of dies, a plurality of gate matching circuits and a plurality of drain matching circuits is provided.

11. A broadband radio frequency (RF) signal amplifier, comprising:
    at least one transistor attached to a surface of a pedestal, the transistor having a RF input and a RF output, a bias input and a bias output; the pedestal comprising a support structure, reference ground and heat sink for the transistor,
    a RF input path electrically connected to the transistor input, an input matching network configured to couple the input signal to the transistor input at an input impedance, and an input direct current (dc) bias network configured to bias the transistor input to an input operating point, and
    a RF output path electrically connected to the transistor output, an output matching network configured to couple the respective component output signal to the transistor output at an output impedance, and an output dc bias networks configured to bias the transistor output to an output operating point.

12. The amplifier of claim 11, wherein a plurality of transistors is provided on the pedestal and wherein the input path includes a splitter configured to split a RF input signal into a plurality of component input signals and wherein the splitter, input matching networks and input bias networks are at least partially implemented in a printed circuit board.

13. The amplifier of claim 12, wherein the output path includes a combiner configured to combine component output signals received at the transistor outputs into a RF output signal, and wherein the combiner, output matching networks and output bias networks at least partially are implemented in the printed circuit board.

14. The amplifier of claim 11, wherein the printed circuit board has an opening sized to accommodate the pedestal.

15. The amplifier of claim 11, wherein the input and output paths comprise respective input and output reference ground shelves implemented in a printed circuit board, and the pedestal and printed circuit board are arranged such that the input and output reference ground shelves are adjacent the pedestal surface.

16. The amplifier of claim 15, further comprising respective conductors electrically connecting the input and output reference ground shelves to the pedestal surface.

17. The amplifier of claim 16, wherein the conductors comprise respective sets of bond wires, the printed circuit board and pedestal are located sufficiently close such that the bond wires provide relatively low inductance transmission paths.

18. The amplifier of claim 11, wherein the input matching network comprises a transmission line implemented in a printed circuit board and electrically connecting the component input signals to respective transistor inputs, the transmission lines having lengths, approximating one-fourth of a wavelength of a fundamental frequency of the RF input signal.

19. The amplifier of claim 11, wherein the output matching network comprises transmission lines implemented in a printed circuit board and electrically connecting component output signals to the combiner, the transmission lines having lengths approximating one-fourth of a wavelength of a fundamental frequency of the RF input signal.

20. The amplifier of claim 11, wherein the input matching network comprises a respective input matching capacitor attached to the pedestal, the respective input bias network electrically connects an input dc bias source to a respective input matching capacitor, the output matching networks comprises a respective output matching capacitor attached to the pedestal, and the respective output bias networks electrically connects an output dc bias source to a respective output matching capacitor.

21. The amplifier of claim 20, wherein the input dc bias source is connected to the input matching capacitor via a respective input transmission line implemented in a printed circuit board, and wherein the output dc bias source is connected to the output matching capacitors via a respective output transmission line implemented in the printed circuit board, the respective input and output transmission lines each having a length approximating one-fourth of a wavelength of a fundamental frequency of the RF input signal.

22. The amplifier of claim 20, wherein the input dc bias source is connected to the input matching capacitor, and the output dc bias source is connected to the output matching capacitor, without the either of input or output dc bias source being transmitted via a transmission line having a length approximating one-fourth of a wavelength of a fundamental frequency of the RF input signal.

23. The amplifier of claim 13, wherein the splitter and combiner are passive elements.

24. The amplifier of claim 11, wherein the input impedance is relatively high, and the input operating point is relatively low.

25. The amplifier of claim 13, further comprising
a first plurality of conductors electrically connecting respective input, path transmission lines implemented in the printed circuit board to respective transistor inputs, and
a second plurality of conductors electrically connecting respective output path transmission lines implemented in the printed circuit board to respective transistor outputs.

26. The amplifier of claim 25, wherein the first and second pluralities of conductors comprise respective sets of bond wires extending between the printed circuit board and the pedestal.

27. The amplifier of claim 12, wherein the pedestal and printed circuit board are attached to a common reference ground and heat sink.

28. The amplifier of claim 27, wherein the input and output paths comprise respective input and output reference ground shelves implemented in the printed circuit board, the input and output ground shelves electrically connected to the pedestal by respective pluralities of bond wires providing low inductance paths.

* * * * *